United States Patent
Lubberhuizen et al.

(10) Patent No.: US 10,955,435 B2
(45) Date of Patent: Mar. 23, 2021

(54) CALIBRATION OF VECTORS IN A MEASUREMENT SYSTEM

(71) Applicant: Dialog Semiconductor B.V., 's-Hertogenbosch (NL)

(72) Inventors: Wessel Lubberhuizen, Delden (NL); Ashley Hughes, Ediburgh (GB)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 616 days.

(21) Appl. No.: 15/428,586

(22) Filed: Feb. 9, 2017

(65) Prior Publication Data

US 2017/0227576 A1 Aug. 10, 2017

(30) Foreign Application Priority Data

Feb. 9, 2016 (DE) .......................... 102016201900.7

(51) Int. Cl.
  *G01P 21/00* (2006.01)
  *G01R 33/00* (2006.01)
  (Continued)

(52) U.S. Cl.
  CPC .......... *G01P 21/00* (2013.01); *G01R 33/0035* (2013.01); *G01R 35/005* (2013.01); *G01C 17/38* (2013.01)

(58) Field of Classification Search
  CPC .. G01R 33/35; G01R 35/005; G01R 33/0035; G01R 33/0017; G01P 21/00; G01C 17/38; G01C 25/005; G01C 25/00
  See application file for complete search history.

(56) References Cited

U.S. PATENT DOCUMENTS

| | | | |
|---|---|---|---|
| 7,088,765 B1* | 8/2006 | Green | H04L 27/364 375/142 |
| 2006/0114147 A1* | 6/2006 | Boonstra | G01S 3/023 342/174 |

(Continued)

FOREIGN PATENT DOCUMENTS

WO WO 2013/071257 5/2013

OTHER PUBLICATIONS

"Explicit Solution for Magnetometer Calibration," by Elder M. Hemerly et al, IEEE Transactions on Instrumentation and Measurement, vol. 63, No. 8, Aug. 2014, pp. 2093-2095.

(Continued)

*Primary Examiner* — Mohamed Charioui
*Assistant Examiner* — Christine Y Liao
(74) *Attorney, Agent, or Firm* — Saile Ackerman LLC; Stephen B. Ackerman

(57) ABSTRACT

A method of data calibration, and in particular sensor calibration, which involves gathering an initial first estimate and then binning the data samples, so that calibration can be performed without the need for a known reference stimulus. The present disclosure relates to calibration of vectors in a measurement system, and in particular to calibration of a correction function for systematic errors in successive data vectors. There is provided a method of determining a vector calibration function comprising: binning successive data vectors; and optimising the binned data vectors once data vectors allocated to a minimum number of unique bins have been observed. The method comprises establishing an initial calibration estimate and where the binning and optimising are performed based on said initial calibration estimate.

24 Claims, 7 Drawing Sheets

(51) Int. Cl.
*G01R 35/00* (2006.01)
*G01C 17/38* (2006.01)

(56) References Cited

U.S. PATENT DOCUMENTS

| | | | | |
|---|---|---|---|---|
| 2013/0124127 A1* | 5/2013 | Ahuja | G06F 1/3206 | 702/86 |
| 2014/0019080 A1* | 1/2014 | Chan | G01P 21/00 | 702/104 |
| 2014/0192991 A1* | 7/2014 | Crocco | H04R 29/005 | 381/58 |
| 2015/0285835 A1* | 10/2015 | Karahan | G01P 21/00 | 73/1.38 |
| 2016/0377650 A1* | 12/2016 | Anderson | G01P 21/00 | 702/104 |
| 2019/0041209 A1* | 2/2019 | D'Alfonso | G01C 17/04 | |

OTHER PUBLICATIONS

"Maximum likelihood calibration of a magnetometer using inertial sensors," by Manon Kok et al., Proceedings of the 19th IFAC World Congress, Jan. 2014, pp. 92-97, Series: World Congress, ISSN 1474-6670; vol. 19, Part 1.

"Least squares ellipsoid specific fitting," by Qingde Li et al., ResearchGate, Conference Paper, Feb. 2004, DOI: 10.1109/GMAP.2004.1290055, Source: IEEE Xplore.

"Calibration methods for inertial and magnetic sensors," by S. Bonnet et al., Sensors and Actuators A: Physical, Elsevier B.V., Sensors and Actuators A 156 (2009) 302-311, Apr. 2009.

German Office Action, Reference Number: 10 2016 201 900.7, Applicant: Dialog Semiconductor B.V., dated Jan. 26, 2017, 6 pages, and English language translation, 7 pages.

* cited by examiner

US 10,955,435 B2

CALIBRATION OF VECTORS IN A MEASUREMENT SYSTEM

TECHNICAL FIELD

The present disclosure relates to calibration of vectors in a measurement system, and in particular to calibration of a correction function for systematic errors in successive data vectors.

BACKGROUND

It is required in various contexts to calibrate data to take account of systematic errors in the data vectors. At present, calibration must be performed by first generating a known input stimulus, which provides an expectation of an output. Any difference between the expected output and the actual readings is then known to comprise systematic errors and that information can then be used to calibrate further data readings, by making appropriate adjustments to the subsequent actual readings.

However, it is often not convenient to generate a known input stimulus. It can take time to generate the stimulus, interrupting normal operation of the usual data processing functionality. It can also be difficult to apply the known stimulus, for example if it is required to be applied in factory conditions or in some other artificial environment.

SUMMARY

According to a first aspect of the disclosure there is provided a method of determining a vector calibration function comprising: binning successive data vectors; and optimising the binned data vectors once data vectors allocated to a minimum number of unique bins have been observed.

Optionally, the method comprises establishing an initial calibration estimate and wherein the binning and optimising are performed based on said initial calibration estimate.

Optionally, bins for said binning of successive data vectors are defined based on a direction of a calibrated vector.

Optionally, a bin is defined for each orthant of a space spanned by the data samples.

Optionally, additional bins are defined in boundary regions between the main bins.

Optionally, said boundary regions comprise regions at or within a boundary region of one or more axes of a space.

Optionally, the data samples comprise vectors and a calibration function comprises an affine transformation which applies a Hermitian linear transformation and an offset to raw data samples, with the parameters of the linear transformation and the vector defining the offset define the free parameters of the calibration function.

Optionally, the minimum number of unique bins is at least equal to the number of free parameters in the affine transformation.

Optionally, each of the binned data samples is given a validity period which starts from when the sample is placed in a bin and expires after a set time has expired; and after said validity period has expired the data sample is ignored when the optimisation is carried out.

Optionally, optimising the binned data samples comprises a gradient descent routine.

Optionally, in said gradient descent routine, a cost function is minimised, said cost function representing a deviation from the unit magnitude for each stored data sample.

Optionally, the method comprises checking the validity of an optimised solution and discarding the solution if it fails one or more validity checks.

Optionally, the data samples comprise vectors and a calibration function comprises an affine transformation which applies a Hermitian linear transformation and an offset to raw data samples, with the parameters of the linear transformation and the vector defining the offset define the free parameters of the calibration function.

Optionally, a solution is identified as being invalid if any one or more of its associated free parameters or combinations thereof have magnitudes which exceed or cross predetermined thresholds.

Optionally, an error is flagged if subsequent input vectors assigned to the same bin diverge by more than a given maximum angle.

Optionally, a solution is identified as being invalid only after a set number of errors have been flagged.

Optionally, an initial calibration estimate comprises an identity matrix for the Hermitian linear transformation and a zero offset.

Optionally, an initial calibration estimate comprises an initial set of data samples.

Optionally, the method comprises updating the sampling data until a stopping criterion is met.

Optionally, the stopping criterion comprises determining that the one or more diagonal matrix elements of the Hermitian linear transform is within a specified range.

Optionally, the method comprises resetting the binning process if the initial estimate is poor.

According to a second aspect of the disclosure there is provided a sensor calibration system, comprising a processor arranged to receive sensor data vectors from one or more sensors, determine a calibration function by binning successive data vectors and optimising the binned data vectors once data vectors allocated to a minimum number of unique bins have been observed, and output a calibrated sensor reading.

According to a third aspect of the disclosure there is provided a portable electronic device comprising one or more sensors and the sensor calibration system of the second aspect.

Optionally, the sensors which are arranged to be calibrated by the sensor calibration system comprise: one or more magnetometers and/or one or more accelerometers; and/or one or more radio-frequency receivers, transmitters or transceivers.

DESCRIPTION

While the present disclosure applies generally to calibration of any kind of data, one particular example is that of readings which are obtained by measurement devices, and for the purposes of illustration, we will discuss herein calibration of measurement devices of the type that may be used in a portable computing device such as a mobile telephone, smart phone, tablet computer, wearable device or other sensor node, to provide improved readings for the better functioning of these devices.

The disclosure relates to the calibration of the output readings of such devices and as such the data is being calibrated although it will be appreciated that where a measurement device is provided that has a primary function to measure one type of parameter, the calibration may be referred to as a device calibration; for example calibration of a magnetometer's output may be referred to as a calibration of the data that is processed by the magnetometer, or generally as "magnetometer calibration".

Measurement device calibration may include, for example, the three dimensional case of the calibration of a set of orthogonally placed magnetic field sensors, or the two dimensional case of the correction for imbalance between in-phase and quadrature components of a radio frequency (RF) receiver.

The disclosure addresses problems caused by systematic errors in data vectors. The systematic errors may come from measurement errors, from external factors such as temperature fluctuations or electromagnetic interference, or from other processing which is carried out after measurement, such as amplification or filtering. The systematic errors may be exhibited as gain mismatch between different sensors in an array of sensors, which may occur for example where their sensitivities to the external stimuli are slightly different, and/or as relative offsets. In addition, calibration allows external interference affecting data readings including sensor readings to be compensated for. Examples of this are the hard and soft iron distortions introduced by metal or magnets when attempting to measure the Earth's magnetic field. Such distortions can be removed by calibration, allowing a reliable measure of the target magnetic field. This is of particular relevance to constant distortions introduced by electronic components supporting a magnetometer device.

Figure 1:
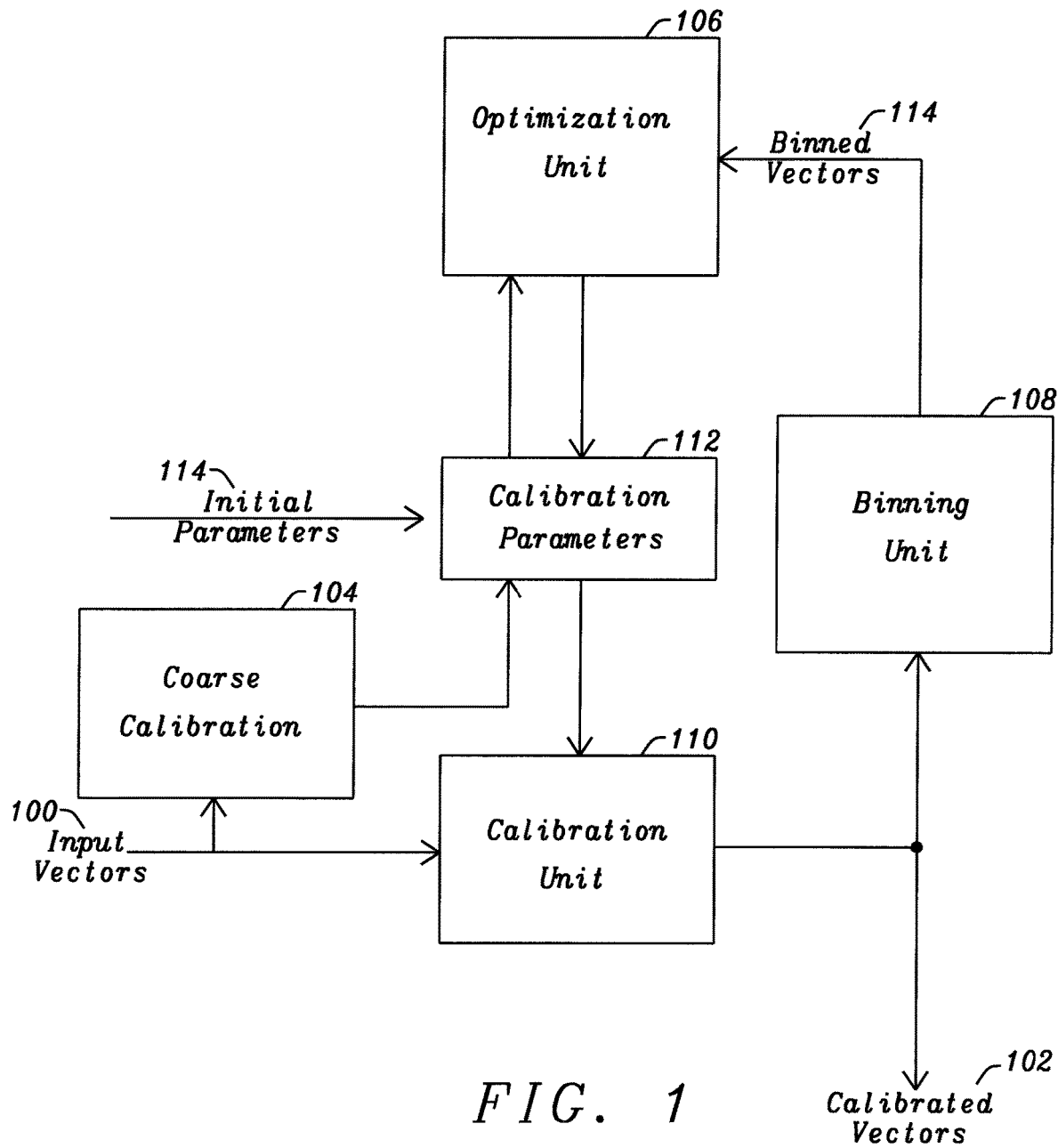
FIG. 1 illustrates schematic components of a system for implementing a calibration function according to the disclosure.

FIG. 1 is a schematic diagram that gives an example of a system for calibration of vectors according to the present disclosure. The system receives input vectors 100 from a data source such as a sensor, sensor array, or generally any source of data, and outputs calibrated vectors 102 which can be provided to a target device such as a portable computing device.

The system comprises an optional coarse calibration unit 104, an optimisation unit 106, a binning unit 108, and a main calibration unit 110. Calibration parameters (which will be discussed and defined below) are derived from the coarse calibration unit 104 which operates on the raw input vectors 100, or from pre-set initial parameters 114. The optimisation unit 106 receives the calibration parameters and applies an optimisation algorithm based on previous stored vectors 114 and the received calibration parameters. The vectors are stored via a binning unit 108, the operation of which will be described below.

It is to be appreciated that the functional schematic of FIG. 1 is not proscriptive as to the physical implementation of a calibration system. Any suitable combination of software, firmware and hardware may be used to implement the illustrated functionalities, and the relevant modules may execute on one or more processors in a distributed, non-distributed, or multiprocessing environment. The system may be implemented on a microprocessor or a digital signal processor (DSP) or any other equivalent.

The calibration system of FIG. 1 can also optionally provide an indication to the rest of the processing chain if the calibrated sensor data is valid or not. This may take the form of a validity flag which is output by the calibration system of FIG. 1 together with the calibrated vectors 102. The validity indication might be used, for example, to indicate that the calibration routine has not yet found a suitable calibration function, or that the raw sensor data is of the wrong scale to be considered as valid input to the target application.

Current practice to determine the calibration function is to use a predefined input stimulus to allow the dynamic range of the or each data source (such as each sensor in an array) to be observed, thereby allowing scaling factors and offsets to be calculated such that the calibrated outputs lie within the desirable range for the target application.

For the magnetometer example, when attempting to measure the Earth's magnetic field, the expected magnitude of the vector has a known and constant magnitude. A calibration routine conditions the raw sensor data such that it conforms to these expectations, or potentially flags the raw data invalid if its magnitude is overly large or small.

The present disclosure calculates and applies a calibration function to raw sensor data at runtime. This means that the calibration can be carried out while a target device is being utilised or a host system is in operation. Because the calibration parameters are continuously updated, it allows correction for systematic errors which are subject to drift.

According to the disclosure, an initial estimate is made of calibration parameters. This may use a pre-set value of the data or may be based on actual data input in order to provide a rough estimate of the calibration parameters.

Then, the initial estimate is optimised, to refine the initial calibration parameter estimate. A particular subset of the observed data vectors over time, which are known to converge to a stable solution, are used to perform optimisation of the calibration parameters. This is achieved by the binning of the sampled vectors of data, and optimisation taking place when vectors allocated to a minimum number of unique bins have been observed. The initial estimate allows the optimisation process to converge quickly to a stable solution.

The invention finds a calibration function C, which can be applied to set of N sensors or other sources of data, which measure a vector field of dimension N, resulting in a calibrated vector value.

In a preferred embodiment the calibration function C is assumed to be an affine transformation that can be expressed as the combination of a Hermitian linear transformation (A) and an offset (b):

$$y = C(x) = A \cdot x + b$$

Where:
x is a column vector of N elements (input data vector)
y is a column vector of N elements (calibrated data vector)
A is a Hermitian N×N matrix
b is a column vector of N elements
An alternative equivalent form is $C(x) = A \cdot (x+b')$, where $b' = A^{-1}b \cdot b' = A^{-1}b$.

For N=2, the affine transform can be defined as:

$$A = \begin{bmatrix} p_1 & p_3 \\ p_3^* & p_2 \end{bmatrix} \quad b = \begin{bmatrix} p_4 \\ p_5 \end{bmatrix}$$

Where $P_l$, with $l=\{1, \ldots, 5\}$, are the free parameters to be determined.

Figure 2:
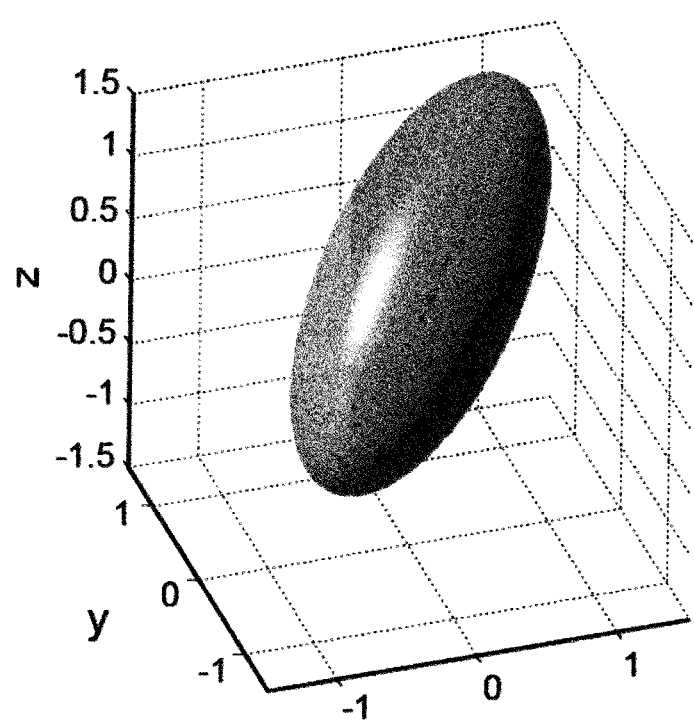
FIG. 2 shows a surface formed by uncalibrated measurements of a distorted vector field in three dimensions.
Figure 3:
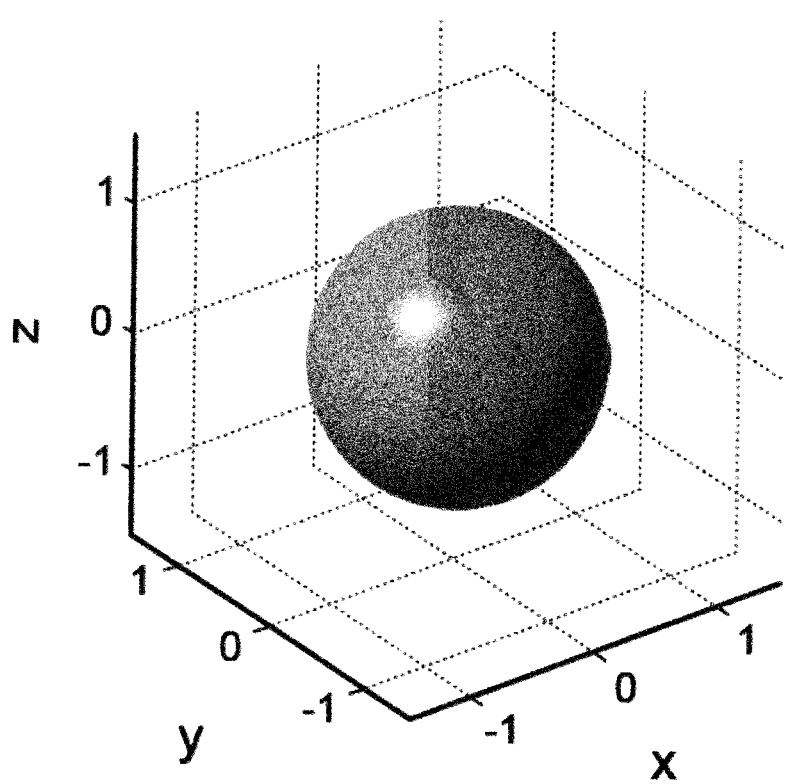
FIG. 3 shows how the same measurements of FIG. 2 should appear after calibration.

Similarly, for N=3, the affine transform can be defined as:

$$A = \begin{bmatrix} p_1 & p_4 & p_5 \\ p_4^* & p_2 & p_6 \\ p_5^* & p_6^* & p_3 \end{bmatrix} \quad b = \begin{bmatrix} p_7 \\ p_8 \\ p_9 \end{bmatrix}$$

Where $P_l$, with $l=\{1, \ldots, 9\}$, are the free parameters to be determined, herein referred to as calibration parameters. The disclosure provides a method of using optimisation on a limited set of input vectors to estimate these free parameters. The calibration function then maps a distorted vector field to a vector field with constant magnitude. FIG. 2 shows an example of an oval surface formed by uncalibrated measurements of a distorted vector field in three dimensions. FIG. 3 shows how the same measurements should appear after calibration—offsets have been removed and the measurements form the surface of a centred sphere.

A Hermitian matrix is equal to its complex transpose. When the elements of the matrix are known to be real, the matrix will be symmetric along the diagonal. The reason for choosing this particular subset of affine transformations is that the cost function E (defined below) is defined in terms of the magnitude of the calibrated output vector, and hence invariant under rotations. This choice excludes rotations and mirror operations from the set of all possible affine transforms, because we cannot calibrate for them.

Initial Calibration

The calibration procedure starts with an initial estimate of the calibration parameters, and continuously refines the estimate. The initial estimate for the calibration parameters may be a pre-set value, for example, assuming an initial estimate for A to be the identity matrix, and an initial estimate for b to be zero. Alternatively, or after an initial estimate based on a pre-set value, an improved initial estimate for the free parameters could be obtained by sampling the sensors over a short time, with a sample at time t from sensor n of N denoted as $x_{(n),t}$.

The initial estimate is preferably based on the assumption that there are no cross-terms (off-diagonal elements in A) in the calibration function: only gain and offset compensation. For each axis, the gain correction values can be estimated by 2 divided by the difference between the maximum and the minimum value along that axis, and the offset can be estimated by the average of the maximum and minimum values, negated and multiplied by the gain correction. Note that when estimating the offset, the minimum value is expected to be negative. If the maximum and minimum values are the same but with different signs, the offset will be zero.

As an example, for N=2, the parameters can be updated using the following, until a stopping criterion is met:

$$p_l = \begin{cases} \dfrac{2}{\max_t(x_{(l),t}) - \min_t(x_{(l),t})} & \text{if } l \in \{1, 2\} \\ 0 & \text{if } l \in \{3\} \\ \dfrac{-p_{(l-3)}\left(\max_t(x_{(l-3),t}) + \min_t(x_{(l-3),t})\right)}{2} & \text{if } l \in \{4, 5\} \end{cases}$$

Similarly, for N=3, the parameters can be updated using the following, until a stopping criterion is met:

$$p_l = \begin{cases} \dfrac{2}{\max_t(x_{(l),t}) - \min_t(x_{(l),t})} & \text{if } l \in \{1, 2, 3\} \\ 0 & \text{if } l \in \{4, 5, 6\} \\ \dfrac{-p_{(l-6)}\left(\max_t(x_{(l-6),t}) + \min_t(x_{(l-6),t})\right)}{2} & \text{if } l \in \{7, 8, 9\} \end{cases}$$

A suitable stopping criterion for the initial calibration stage is for the inverse of each of the relevant free parameters $p_l$ be greater than some threshold value (or as an equivalent that the gains are lower than the inverse of a threshold)—so that the minimum and maximum observed values for each of the sensors are sufficiently diverged such that it might be reasonable to assume that the values corresponding to the minimum and maximum values under normal operating conditions have been observed. As such, these values might then be used to correct offsets and scaling factors, such that the sensors are calibrated to output data in the expected range, given the range of values observed under normal operating conditions.

Refinement of Initial Estimate

The initial estimate is refined using a vector binning method to provide a set of unique vectors on which an optimisation algorithm can be performed to find a solution for the calibration free parameters. The initial estimates of these parameters are used by the refining step as a starting point for optimisation.

Binning

A binning function B maps each incoming vector x to a particular bin, based on the direction of C(x), that is, the direction in which the calibrated sensor data moves from the initial estimate.

Each bin comprises a particular subset of sample values. The subsets defined by different bins are non-overlapping. For each bin we retain one representative input vector, which is updated when a new sample is found which falls into that particular bin. The retained vectors are labelled with a bin identifier, and made available to the optimisation algorithm by an array which indexed by the bin identifiers. Therefore, binning successive data samples involves allocating each input vector to one of a predetermined subsets of vector values (a bin), and retaining only a single sample from each bin, with newer vectors replacing older ones.

The incoming vector is then saved in an array, indexed by the bin. If the bin previously contained a vector, that existing vector is replaced. The set of bins represents the known set of sensor values which will lead to a stable parameterisation solution. The bins should span the space of all possible solutions, be disjoint, and there should be at least as many bins as the number of free parameters.

Optionally, each vector is given a validity period, which is reset for each bin when a new vector is placed in the bin. When the validity period expires, then the vector in the corresponding bin can be marked as invalid and so is ignored by the optimisation algorithm. This prevents erroneous data from continually contributing to the error function in the optimization stage, which becomes important if the calibrated device is held stationary, as it prevents long term drift of the calculated free parameters.

The binning function can sub-divide the solution space into any number of bins, so long as there are at least as many bins as there are free parameters. A relatively small number of bins provides greater speed and computational efficiency, but this comes at the expense of accuracy. A relatively large number of bins provides greater accuracy, but at the expense of speed and computational efficiency. There will be a trade-off in the choice of the number of bins, with the appropriate number depending on the requirements and constraints of a given application.

For two dimensional vectors (N=2) a possible binning function is to split all possible directions in a Euclidian space representable by the two sensor values into quadrants. Further bins ("guard bins") can also be added for vectors which are within one or more threshold distances of the axes of the space. These additional bins provide a guard against two vectors in neighbouring bins being arbitrarily close to each other, thereby ensuring that all bins contain independent vectors. This ensures that the resulting optimisation problem for the set of stored vectors is not ill-conditioned.

For three dimensional vectors (N=3), a possible binning function is to split the Euclidian space representable by the three sensor values into octants, according to the signs of the sensor values. Again, further bins ("guard bins") can be added for vectors which are within some set of threshold distances of the axes of the space. These additional bins provide a guard against two vectors in neighbouring bins being arbitrarily close to each other, thereby ensuring that all bins contain independent vectors. This ensures that the resulting optimisation problem for the set of stored vectors is not ill-conditioned.

Figure 4:
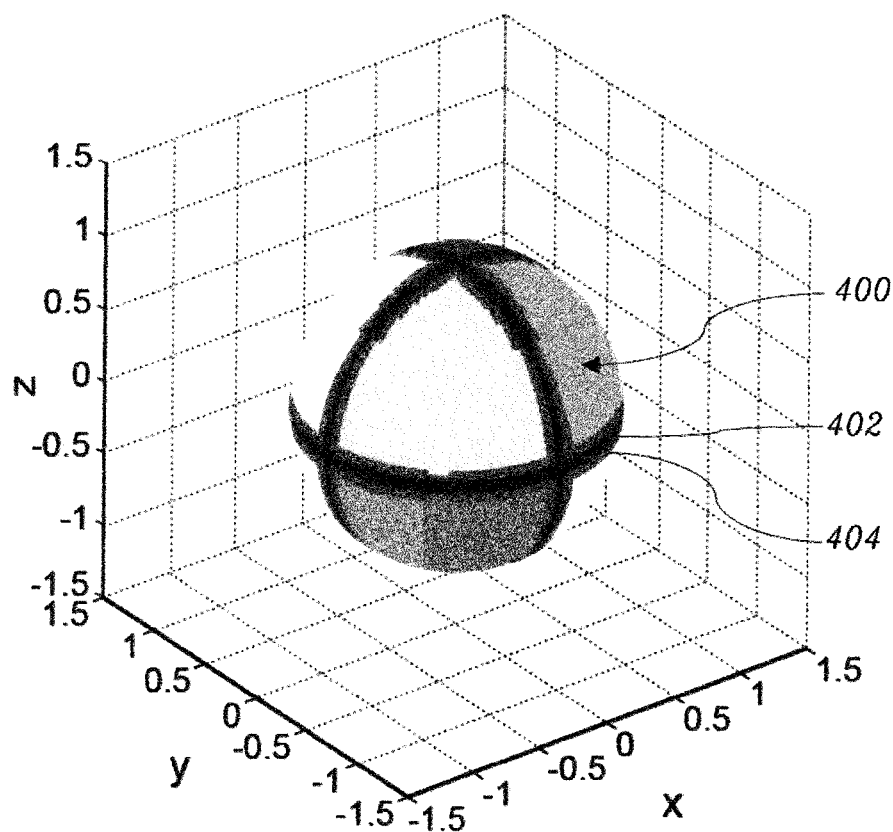
FIG. 4 shows a visualisation of three-dimensional vector indexing bins.

An example of this configuration is illustrated in FIG. 4 for three dimensions, with different bins indicated in different colours. The illustrated sphere is centred at the origin, which represents the value of the initial calibration estimate. After the calibration function has been applied, each octant of the resulting (spherical) surface (one is shown with reference 400) is assigned to a separate bin, as well as there being two additional bins close to each of the axes of the space. One bin 402 (darker shading) is closest to the axes, and another bin 404 (lighter shading) is a bin index which isn't continuous, and is between the one axis bin 402 and an octant 400. It will generally be efficient and sufficient to have two bins but they could be split into separate bins if desired.

It will be appreciated that a similar approach would apply to vectors of higher orders. The space represented by sensor values can be split into different orthants or other sub-sectors depending on the direction of the calibrated readings, and it is possible to provide additional bins having boundaries within set thresholds of each axis of the space in order to ensure that all bins contain independent vectors.

Optionally samples that have a calibrated value that has a magnitude that is smaller than a configurable minimum value, or larger than a configurable maximum value are considered to be 'outliers', which should be ignored: they will not lead to an update of any bin representative value.

Gradient Descent

When the number of occupied bins k exceeds a threshold value $K_{min}$, the procedure continues with an optimisation algorithm. In a preferred embodiment the optimisation algorithm comprises a gradient descent method.

The threshold $K_{min}$ should be set to guarantee that at least as many independent vectors have been observed as there are free parameters. This ensures that there will be a unique space defined (an ellipsoid for N=3, an ellipse for N=2) defined, on the surface of which the observed vectors lie.

For example, for N=3, $K_{min}$ can be chosen to be 10, guaranteeing at least 9 independent vectors, and for N=2, $K_{min}$ can be chosen to be 6, guaranteeing at least 5 independent vectors.

A cost function E is defined that represents the total deviation from unit magnitude for each stored vector. The total error is the sum of the error from each vector. The squared error function to be minimized is then defined as:

$$E(C) = \sum_{k=1}^{K} \left(\sqrt{y[k] \cdot y[k]} - 1\right)^2$$

Where $$y[k] = c(x[k])$$

The cost function E can be optimized using the gradient descent method. The gradient can be computed as the product of two derivative factors:

$$\frac{\partial E}{\partial p_l} = \sum_{k=1}^{K} \frac{\partial E}{\partial y[k]} \cdot \frac{\partial y[k]}{\partial p_l}$$

Where:

$$\frac{\partial E}{\partial y} = \left(\frac{\partial E}{\partial y_1}, \frac{\partial E}{\partial y_n}, \dots, \frac{\partial E}{\partial y_N}\right) \text{ and } \frac{\partial E}{\partial y_n} = y_n(y \cdot y - 1)$$

and:

$$\frac{\partial y}{\partial p_l} = \left(\frac{\partial y_1}{\partial p_l}, \frac{\partial y_n}{\partial p_l}, \dots, \frac{\partial y_n}{\partial p_l}\right)$$

Where each of $$\frac{\partial y_n}{\partial p_l}$$

can be obtained directly from differentiating C(x).

The expression given for $$\frac{\partial E}{\partial y_n}$$

is an approximation, and the full expression is:

$$\frac{\partial E}{\partial y_n} = 2y_n\left(1 - \frac{1}{\sqrt{y \cdot y}}\right)$$

When y·y is close to 1, then the following approximation for $\sqrt{y \cdot y}$ can be made:

$$\sqrt{y \cdot y} = \sqrt{1+\varepsilon} \approx 1 + 0.5\varepsilon = 1 + 0.5(y \cdot y - 1)$$

By substitution, this allows E(C) to be expressed as:

$$E(C) = (0.5(y \cdot y - 1))^2$$

This in turn leads to the simplified expression for $$\frac{\partial E}{\partial y_n}.$$

Detection of Invalid Solutions

Solutions may arise to the optimisation of the free parameters which do not represent a true calibration of the sensor array. In particular, as the diagonal terms of A (representing gains) tend towards 0, the calibrated output always tends towards the vector b. As such there is a space of local minima of the error function, which must be avoided. If the system reaches this state, steps must be taken to correct the problem, for example, a reset.

Detecting such a solution can be achieved by several means. Thresholds might be put on the calibration free parameters to detect these invalid states. Alternatively, the binning system can be used as a detection system by noting that subsequent input vectors which are assigned to the same bin should have some maximum angle between them. In particular, vectors assigned to one of the orthants in an N-dimensional system should always be at an angle of less than 90° to each other.

This condition can be checked for each new input vector by taking its dot product with the vector previously stored in the bin assigned to that new vector. Because:

$$a \cdot b = \|a\|\|b\|\cos\theta$$

The result can be compared to a threshold to detect large angles between vectors, as it is dependent on θ, the angle between them. In the simple case for orthants, the error condition can be triggered if the dot product is less than 0. In practice, it may be required that this condition be triggered several times consecutively before taking corrective action, to deal with computational inaccuracies, noisy data, and large angles between vectors potentially being valid in the guard bins.

Poor initial estimates may cause the binning function to change significantly over time, such that an input vector might be binned differently following an update of the parameter estimates, given that input vector. It is possible to deal with this situation by comparing the calculated pre- and post-parameter-update indexes of the input vector. If they are different, then the binning function has changed significantly. In this case, it may be beneficial to re-run the binning function on all saved vectors using the updated free parameters.

Estimate of True Vector Field Magnitude

In a given application of the disclosure, an estimate of the vector field local magnitude may or may not be known a priori. The invention can function in either case, with free parameters calculated such that the resulting sphere is either a unit sphere or a sphere scaled to a desired target radius. If an estimate of the true magnitude of the vector field is required, then this might be derived using the matrix A of the calibration function. An estimate of the magnitude might be given by, for example, consideration of the root mean square magnitude of the elements of $A^{-1}$. Note that the absolute accuracy of such a calculation is limited by the accuracy of the sensitivity of the measurement devices used.

Resulting System

Figure 5A:
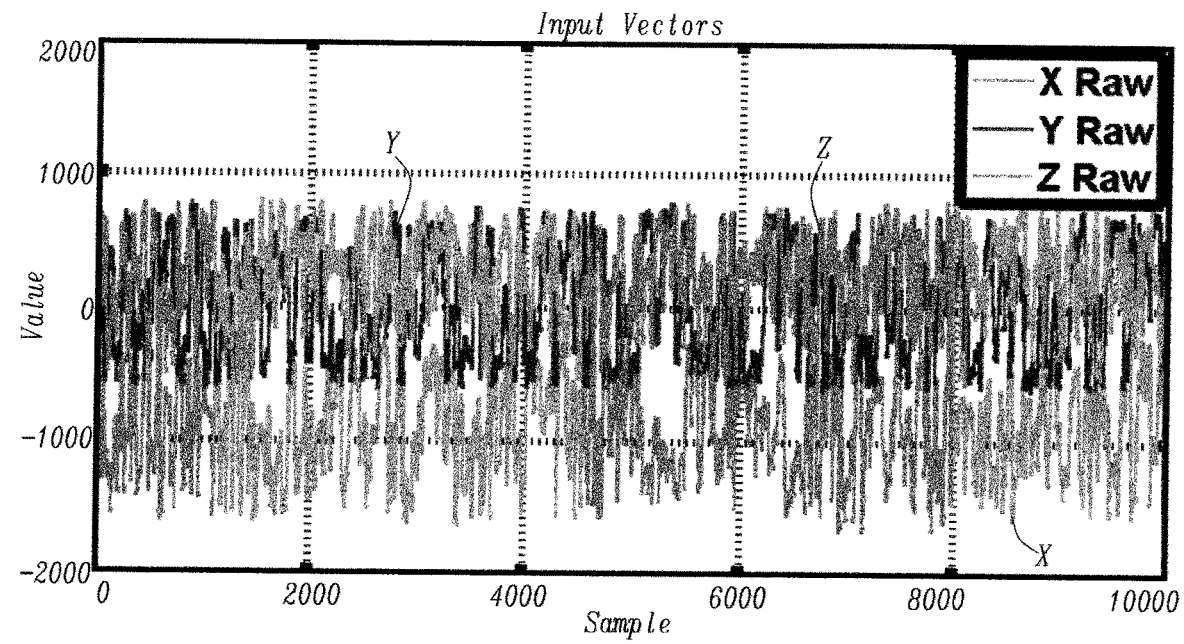
FIGS. 5a and 5b show a set of input vectors recorded by a sensor device, followed by the calibrated vectors achieved when the calibration parameters are calculated without binning.
Figure 5B:
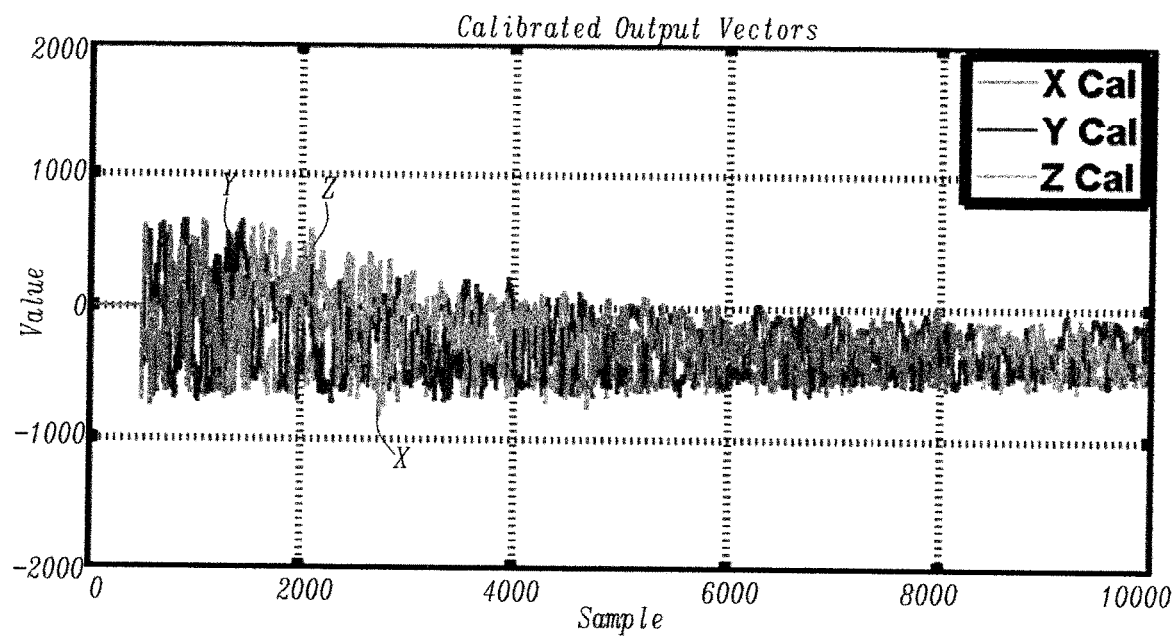
Figure 6A:
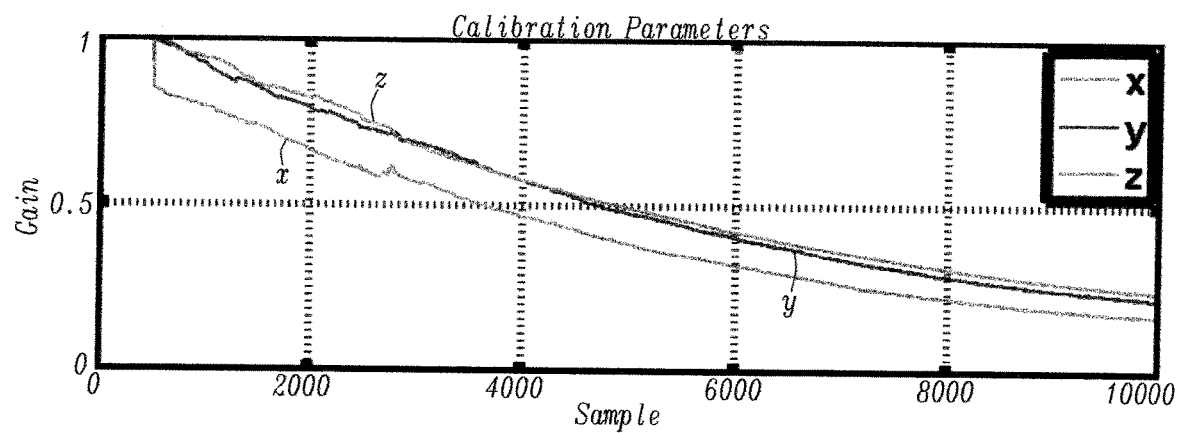
FIGS. 6a, 6b, and 6c show calculated parameters using parameter optimisation without binning.
Figure 6B:
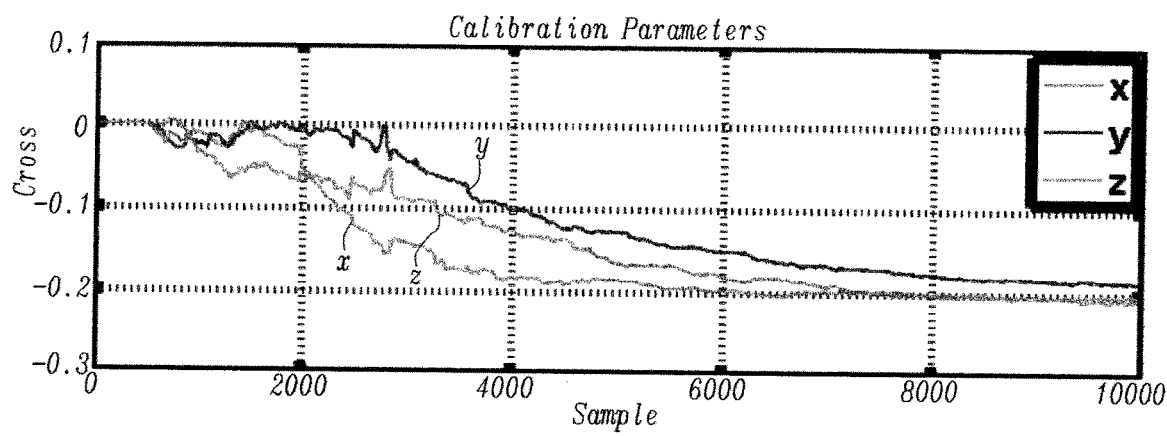
Figure 6C:
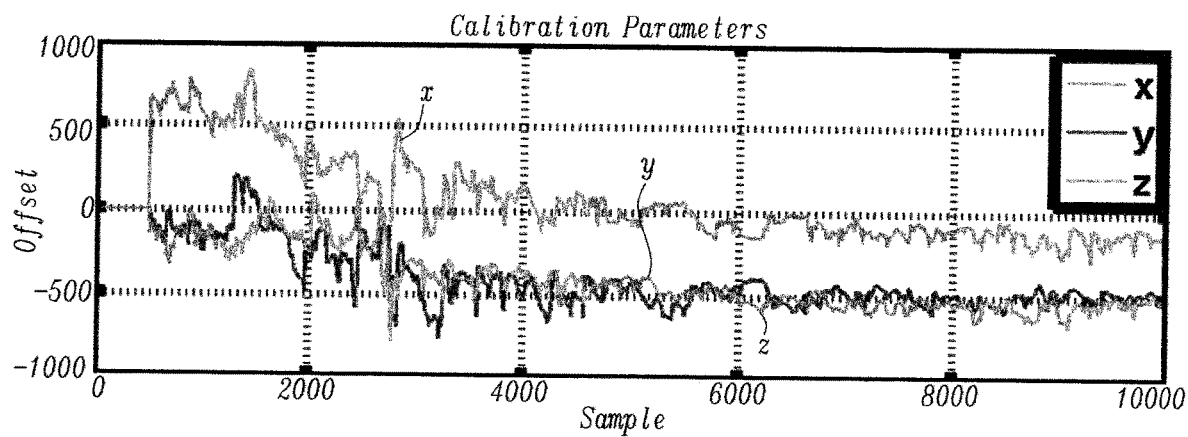

The resulting system has been found to converge quickly to a stable solution, comparing favourably to a system which optimises the calibration parameters without the binning step. FIG. 5a shows a set of input vectors recorded by a sensor device, followed by in FIG. 5b the calibrated vectors achieved when the calibration parameters are calculated without binning. Instead of binning, the most recently observed 10 ($K_{min}$ for N=3) input vectors over time are used as the input to the optimisation step. Note that the magnitude of the output vector decreases over time, when it should remain constant. This is because the calibration parameters do not settle on a suitable stable solution, as shown in FIGS. 6a, 6b and 6c.

Figure 7A:
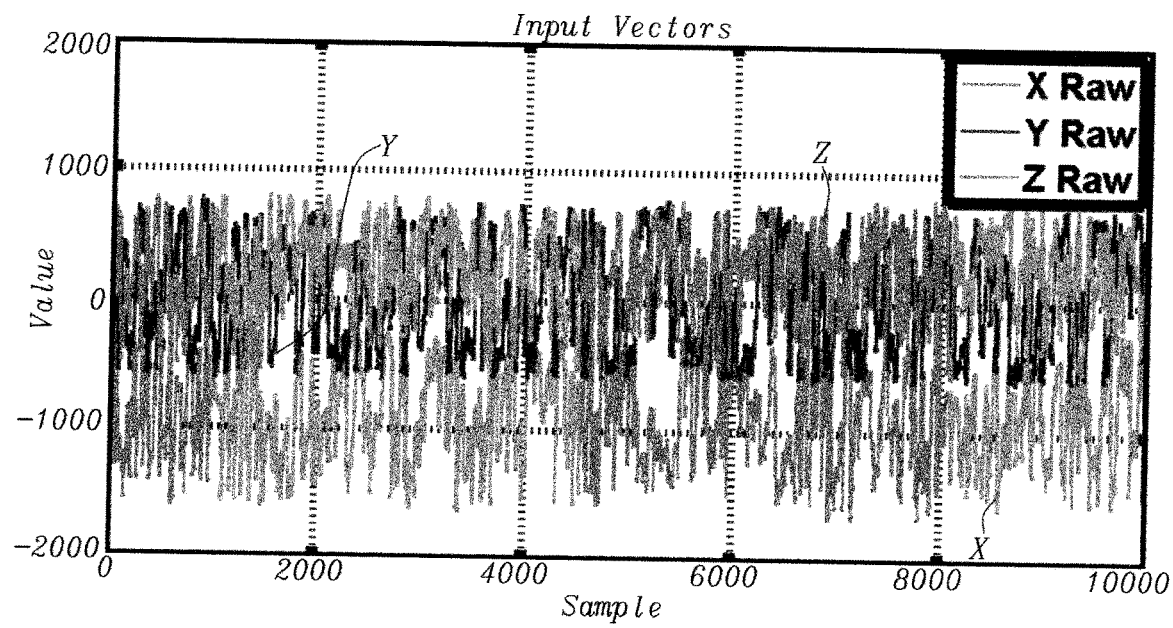
FIGS. 7a and 7b show input and output vectors using parameter optimisation with binning.
Figure 7B:
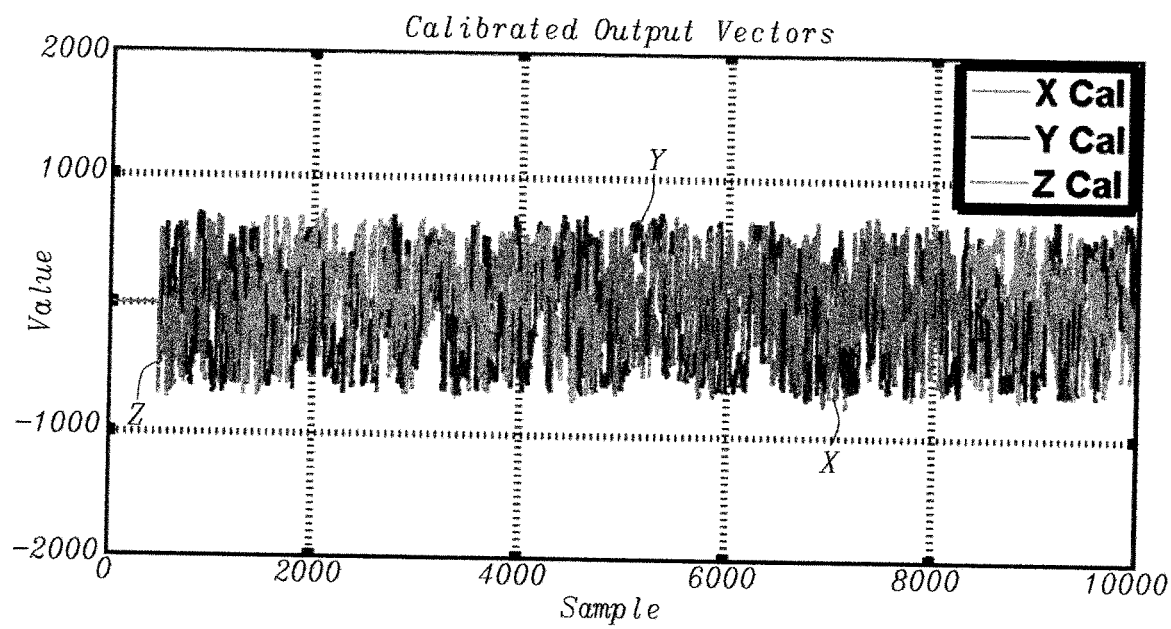
Figure 8A:
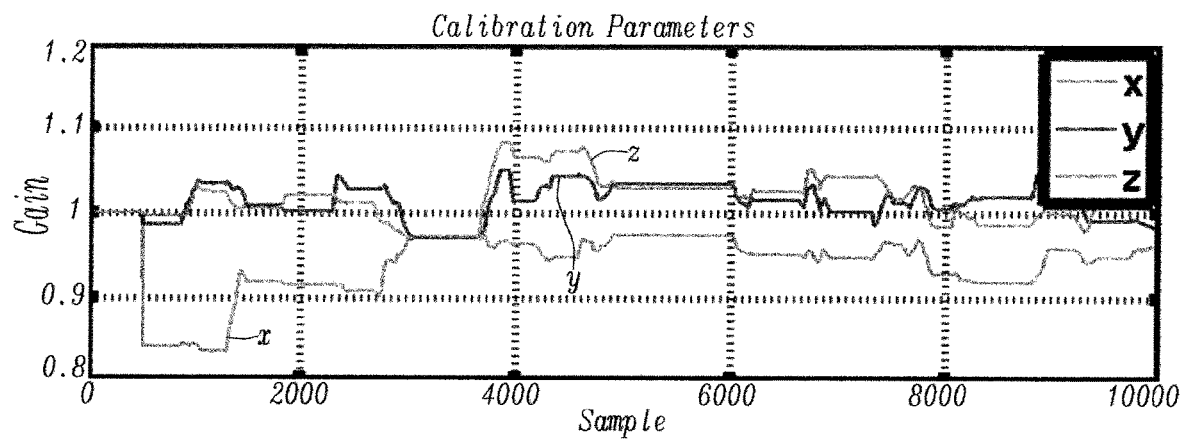
FIGS. 8a, 8b, and 8c show calculated parameters using parameter optimisation with binning.
Figure 8B:
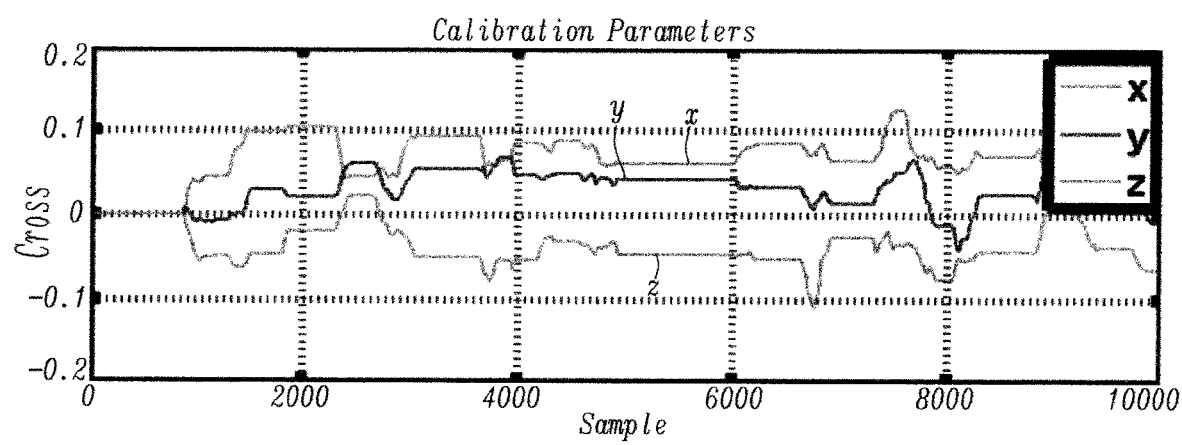
Figure 8C:
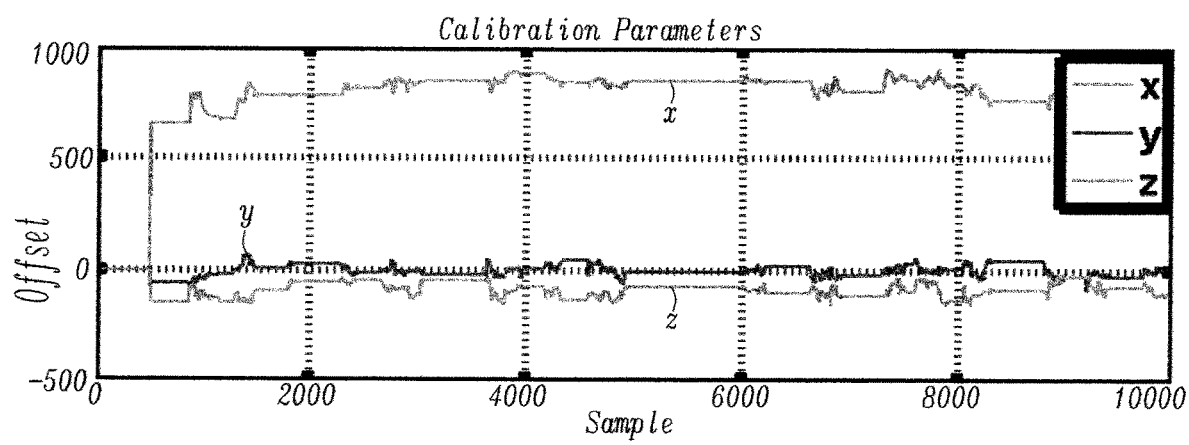

In contrast, FIG. 7a shows the same input data being processed using the optimisation stage with binned data. The figure shows that the optimisation algorithm settles on a stable solution, successfully removing a large offset present on the x-axis sensor whilst maintaining the magnitude of the output vector. The corresponding calculated parameter coefficients using optimisation on binned data are shown over time in FIG. 7b.

In FIGS. 6a, 6b, 6c and FIGS. 8a, 8b, 8c, the parameters labelled, 'Gain' correspond to free parameters $P_1$, $P_2$ and $P_3$ for the x, y, and z axes respectively. The parameters labelled, 'Cross' correspond to free parameters $P_3$, $P_4$ and $P_5$ for the xy, yz, and xz cross terms respectively. The parameters labelled, 'Offset' correspond to free parameters $P_7$, $P_8$ and $P_9$ for the x, y, and z axes respectively.

The disclosure provides novel methods as described herein, as well as apparatus for implanting the methods. The disclosure is not limited to any particular physical implementation, and it will be appreciated that appropriate software, firmware and hardware may be provided for carrying out the disclosure. In particular, the disclosure may provide application specific integrated circuits or be encoded in a field-programmable gate array or other reprogrammable circuitry. Alternatively, the disclosure may be implemented by suitable software running on an appropriate processor. Sensor systems and devices incorporating sensor systems may also be provided according to the disclosure.

The disclosure provides many advantageous features. A calibration function can be calculated and applied to data from an array of sensors or other data sources, using only the raw data sampled. The calibration function should correct for differences in scaling and offsets between sensors due to manufacturing tolerances as well as constant external influences in the vector field that is being measured. The disclosure does not require a pre-defined input stimulus in order to function and can apply the calibration function to raw sensor data at runtime, whilst a target device is being utilised.

As described above, the use of binned vectors also leads to a method for detecting invalid calibration coefficients, caused by optimisation reaching a local minimum of an error function rather than the desired target minimum error state. These low error but invalid states can be reached in the presence of interference signals or noise in the sensor readings.

The proposed invention has the following advantages:
- Requires storing and running optimization on only as many vectors as there are bins defined
- Scales for vector fields of N dimensions
- Design of bin arrangement allows convergence to stable solution Simple detection of a significantly changed external environment by the detection of poor solutions to the optimisation step.

Ability to cope with poor initial estimates with a re-binning step.

Low computational requirements, suitable for use in low power systems

The ability to perform calibration only on raw data with magnitude greater than some minimum threshold (to avoid, for example, potential issues with system noise) and/or with magnitude less than some maximum threshold level.

Various improvements and modifications may be made to the above without departing from the scope of the disclosure.

It should be understood that the logic code, programs, modules, processes, methods, and the order in which the respective elements of each method are performed are purely exemplary. Depending on the implementation, they may be performed in any order or in parallel, unless indicated otherwise in the present disclosure. Further, the logic code is not related, or limited to any particular programming language, and may comprise one or more modules that execute on one or more processors in a distributed, non-distributed, or multiprocessing environment.

What is claimed is:

1. A method of determining a vector calibration function, the method comprising:
   binning successive input data vectors; and
   optimising free parameters once input data vectors allocated to a minimum number of unique bins have been observed, the vector calibration function comprising the optimised free parameters; wherein:
   bins for said binning of successive input data vectors are defined based on a direction of a calibrated vector.

2. The method of claim 1, comprising establishing an initial calibration estimate and wherein the binning and optimising are performed based on said initial calibration estimate.

3. The method of claim 1, wherein a bin is defined for each orthant of a space spanned by the data samples.

4. The method of claim 1, wherein additional bins are defined in boundary regions between the main bins.

5. The method of claim 4, wherein said boundary regions comprise regions at or within a boundary region of one or more axes of a space.

6. The method of any claim 1, wherein the data samples comprise vectors and a calibration function comprises an affine transformation which applies a Hermitian linear transformation and an offset to raw data samples, with the parameters of the linear transformation and the vector defining the offset define the free parameters of the calibration function.

7. The method of claim 6, wherein the minimum number of unique bins is at least equal to the number of free parameters in the affine transformation.

8. The method of claim 6, wherein an initial calibration estimate comprises an identity matrix for the Hermitian linear transformation and a zero offset.

9. The method of claim 6, wherein an initial calibration estimate comprises an initial set of data samples.

10. The method of claim 9, comprising updating the sampling data until a stopping criterion is met.

11. The method of claim 10, wherein the stopping criterion comprises determining that the one or more diagonal matrix elements of the Hermitian linear transform is within a specified range.

12. The method of claim 1, wherein each of the binned data samples is given a validity period which starts from when the sample is placed in a bin and expires after a set time has expired; and after said validity period has expired the data sample is ignored when the optimisation is carried out.

13. The method of claim 1, wherein optimising the free parameters comprises a gradient descent routine.

14. The method of claim 13, wherein, in said gradient descent routine, a cost function is minimised, said cost function representing a deviation from the unit magnitude for each stored data sample.

15. The method of claim 1, comprising checking the validity of an optimised solution and discarding the solution if it fails one or more validity checks.

16. The method of claim 15, wherein the data samples comprise vectors and a calibration function comprises an affine transformation which applies a Hermitian linear transformation and an offset to raw data samples, with the parameters of the linear transformation and the vector defining the offset define the free parameters of the calibration function.

17. The method of claim 16, wherein a solution is identified as being invalid if any one or more of its associated free parameters or combinations thereof have magnitudes which exceed or cross predetermined thresholds.

18. The method of claim 16, wherein an error is flagged if subsequent input vectors assigned to the same bin diverge by more than a given maximum angle.

19. The method of claim 18, wherein a solution is identified as being invalid only after a set number of errors have been flagged.

20. The method of claim 1, wherein said successive input data vectors comprise sensor data vectors from one or more sensors.

21. The method of claim 20, wherein said one or more sensors comprise one or more magnetometers, and/or one or more accelerometers, and/or one or more radio-frequency receivers, transmitters or transceivers.

22. A sensor calibration system, comprising a processor arranged to receive
   sensor data vectors from one or more sensors, determine a vector calibration function by binning successive input data vectors and optimising free parameters once input data vectors allocated to a minimum number of unique bins have been observed, the vector calibration function comprising the optimised free parameters, and output a calibrated sensor reading, wherein bins for said binning of successive input data vectors are defined based on a direction of a calibrated vector.

23. A portable electronic device comprising one or more sensors and a sensor calibration system comprising a processor arranged to receive sensor data vectors from one or more sensors, determine a vector calibration function by binning successive input data vectors and optimising free parameters once input data vectors allocated to a minimum number of unique bins have been observed, the vector calibration function comprising the optimised free parameters, and output a calibrated sensor reading, wherein bins for said binning of successive input data vectors are defined based on a direction of a calibrated vector.

24. The portable electronic device of claim 23, wherein the sensors which are arranged to be calibrated by the sensor calibration system comprise: one or more magnetometers and/or one or more accelerometers; and/or one or more radio-frequency receivers, transmitters or transceivers.

* * * * *